United States Patent
Zeng et al.

(10) Patent No.: US 10,374,624 B2
(45) Date of Patent: Aug. 6, 2019

(54) DIGITAL TO ANALOG CONVERSION CIRCUIT AND DATA SOURCE CIRCUIT CHIP

(71) Applicant: Shenzhen China Star Optoelectronics Technology Co., Ltd., Shenzhen, Guangdong (CN)

(72) Inventors: Dekang Zeng, Guangdong (CN); Fengcheng Xu, Guangdong (CN); Dongsheng Guo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 97 days.

(21) Appl. No.: 15/305,339

(22) PCT Filed: Jul. 12, 2016

(86) PCT No.: PCT/CN2016/089792
§ 371 (c)(1),
(2) Date: Oct. 19, 2016

(87) PCT Pub. No.: WO2017/201832
PCT Pub. Date: Nov. 30, 2017

(65) Prior Publication Data
US 2018/0175877 A1    Jun. 21, 2018

(30) Foreign Application Priority Data
May 26, 2016 (CN) .......................... 2016 1 0365127

(51) Int. Cl.
*G09G 3/20* (2006.01)
*H03M 1/66* (2006.01)
*H03M 1/76* (2006.01)

(52) U.S. Cl.
CPC ............ *H03M 1/66* (2013.01); *G09G 3/2092* (2013.01); *H03M 1/76* (2013.01); *G09G 2310/027* (2013.01)

(58) Field of Classification Search
CPC ........ H03M 1/66; H03M 1/76; G09G 3/2092; G09G 2310/027
See application file for complete search history.

(56) References Cited

U.S. PATENT DOCUMENTS

| | | | |
|---|---|---|---|
| 2007/0030192 A1* | 2/2007 | Son | G09G 3/20 341/156 |
| 2007/0085781 A1* | 4/2007 | Chung | G09G 3/3233 345/76 |
| 2008/0094264 A1 | 4/2008 | Lin | |

FOREIGN PATENT DOCUMENTS

| | | |
|---|---|---|
| CN | 204168121 U | 2/2015 |
| JP | PH0286330 A | 3/1990 |
| JP | H0555921 A | 3/1993 |

\* cited by examiner

Primary Examiner — Robert J Michaud
(74) Attorney, Agent, or Firm — Andrew C. Cheng

(57) ABSTRACT

The present disclosure provides a digital to analog conversion (DAC) circuit and a data source circuit chip, the DAC circuit includes: first MOS tubes with the same number of the inputted digital bits; a second resistance, one end of the second resistance connects to the reference voltage, another end of the second resistance connects to the output terminal of the circuit; a second MOS tube, the drain of the second MOS tube connects to the output terminal of the circuit, the gate of the second MOS tube receives a row blank signal; and a capacitor, one end of the capacitor connects to the output terminal, another end of the capacitor is grounded. Using the above circuit and data source circuit chip, can
(Continued)

greatly reduce the number of the MOS tube used in the DAC circuit, to effectively reduce the volume of the data source circuit chip and cost.

4 Claims, 2 Drawing Sheets

DIGITAL TO ANALOG CONVERSION CIRCUIT AND DATA SOURCE CIRCUIT CHIP

BACKGROUND OF THE INVENTION

1. Field of the Disclosure

The present disclosure relates to a signal conversion technology field, and more particularly to a digital to analog conversion circuit reducing the number of the MOS transistor and a data source circuit chip for the display panel.

2. Description of the Prior Art

In the working process of the display panel, usually it requires a data source circuit chip (source IC) to convert the digital bit of the control chip (TCON) transmitted to the analog voltage value, then the analog voltage value will charge and discharge the display panel through the display data circuit on the display array, in order to achieve the normal display of the each pixel in the display panel.

In the prior art, typically by the digital to analog conversion module (DAC module) in the Source IC to achieve the conversion from the digital bit to the analog voltage value, and largely the area and cost of the Source IC is decided by the DAC module.

FIG. 1 is a circuit diagram of the DAC module in the Source IC in the prior art, in the present embodiment, with the DAC module inputted three bit (3 bit) as an example, in order to be able to convert the 3 bit to the 8 (8 step) corresponding voltage value, generally require the number of the switching MOS transistor is 24 (i.e. $3 \times 2^3$). If the input of the DAC module is 8 bit, generally require the number of the switching MOS transistor is 2048 (i.e. $8 \times 2^8$).

And, each channel in the source IC require the separate DAC module to process the DAC, i.e. if the number of a 8 bit source IC output channel is 960, the number of the required switching MOS transistor in the DAC module is up to 1966080 (i.e. 960×2048). If the number of the source IC is 10 bit, the number of the required switching MOS transistor is even more.

The number of the MOS transistor is greater, result in the volume of the source IC is greater, and the cost is higher.

SUMMARY OF THE DISCLOSURE

The exemplary embodiment of the present disclosure is to provide a digital to analog conversion circuit reducing the number of the MOS transistor and a data source circuit chip, effective to reduce the volume of data source circuit chip and reduce costs.

According to an aspect of an exemplary embodiment, there is provided a digital to analog conversion circuit, the circuit includes: first MOS transistors with the same number of the inputted digital bits, wherein, any one of the gate of the first MOS transistor receives a digital bit, the any one of the drain of the first MOS transistor connects to the output terminal of the circuit, the any one of the source of the first MOS transistor connects to the one end of the first resistor, another end of the first resistor connects to a reference voltage, a second resistor, one end of the second resistor connects to the reference voltage, another end of the second resistor connects to the output terminal of the circuit, a second MOS transistor, the drain of the second MOS transistor connects the output terminal of the circuit, the source of the second MOS transistor is grounded, the gate of the second MOS transistor receives a row blank signal, a capacitor, one end of the capacitor connects to the output terminal, another end of the capacitor is grounded.

Wherein, the number of the first resistor and the number of the first MOS transistor of the circuit included are the same, a resistance of each of the first resistor is varied with the varying of the power of the digital bit, wherein the resistance of the first resistor connected with the highest digital bit through the first MOS transistor is minimum, the resistance of the first resistor connected with the lowest digital bit through the first MOS transistor is maximum.

Wherein, the resistance of the second resistor is greater than the resistance of the first resistor connected with the lowest digital bit.

Wherein, the capacitance of the capacitor is fixed.

Wherein, the any one of the first MOS transistor is turned on the any one of the first MOS transistor according to the value of the digital bit received from the gate, so that the first resistor of the any one of the first MOS transistor connected is accessed into the circuit, between the each first resistor in the accessed circuit is connected in parallel, between the each first resistor and the second resistor in the accessed circuit is connected in parallel.

Wherein, a horizontal scanning period includes a display stage and a display blank stage, the display stage according to the value of the digital bit to charge the capacitor, so that provide the gray voltage of the output terminal of the digital to analog conversion circuit to the display panel, in the display blank stage, all of the first MOS transistor are turned off, the second MOS transistor is turned on according to the row blank signal, the capacitor is discharged through the second MOS transistor, before charging for the capacitor every time, the charge of the capacitor is zero.

Wherein, the resistance of the each first resistor and second resistor accessed in the circuit after connected in parallel and the gray voltage of the output terminal of the digital to analog conversion circuit are presented as varies nonlinearly.

Wherein, the gray voltage of the output terminal of the digital to analog conversion circuit is calculated by the following equation:

$$V_{gm} = V_{ref} - V_{ref} e^{-t/RC}$$

Wherein, $V_{gm}$ is the gray voltage of the output terminal of the digital to analog conversion circuit, $V_{ref}$ is the reference voltage, R is the resistance of the each first resistor and second resistor in the accessed circuit after connected in parallel, C is capacitor, t is the charge time of the capacitor.

According to another aspect of an exemplary embodiment, there is provided a data source circuit chip, the data source circuit chip includes a receiver, a shift register, a line memory, a level booster circuit and a digital to analog conversion circuit and an amplifying circuit.

With the above DAC circuit and the data source circuit chip, can greatly reduce the number of the MOS transistor required in the DAC circuit, in order to reduce the volume of the data source circuit chip and the cost.

DETAILED DESCRIPTION OF PREFERRED EMBODIMENTS

Now it will be hereinafter more fully described with reference to exemplary embodiments of the drawings; however, these examples can be embodied in different forms and embodiments and should not be construed as limited to the embodiments set forth herein. Instead, these embodiments are provided so that this disclosure will be thorough and complete, and the scope of exemplary embodiment will fully convey to those skilled in the art.

The DAC circuit according to the exemplary embodiment of the present disclosure includes a capacitor, a second resistor, a second MOS transistor, and first MOS s transistors with the same number of the inputted digital bits and first resistors with the same number of the first MOS transistor.

Specifically, any one of the gate of the first MOS transistor receives a digital bit, the any one of the drain of the first MOS transistor connects to the output terminal of the circuit, the any one of the source of the first MOS transistor connects to the one end of the first resistor, another end of the first resistor connects to a reference voltage, a second resistor, one end of the second resistor connects to the reference voltage, another end of the second resistor connects to the output terminal of the circuit, a second MOS transistor, the drain of the second MOS transistor connects the output terminal of the circuit, the source of the second MOS transistor is grounded, the gate of the second MOS transistor receives a row blank signal, a capacitor, one end of the capacitor connects to the output terminal, another end of the capacitor is grounded.

Figure 1:
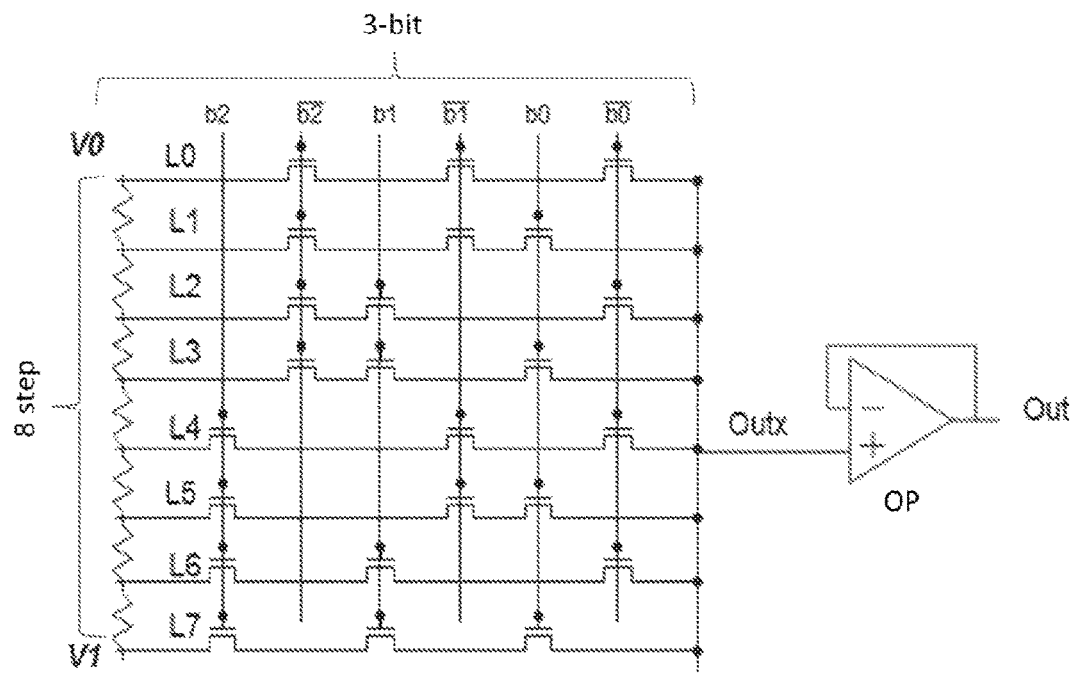
FIG. 1 is a circuit diagram of the DAC module in the source IC in the prior art.
Figure 2:
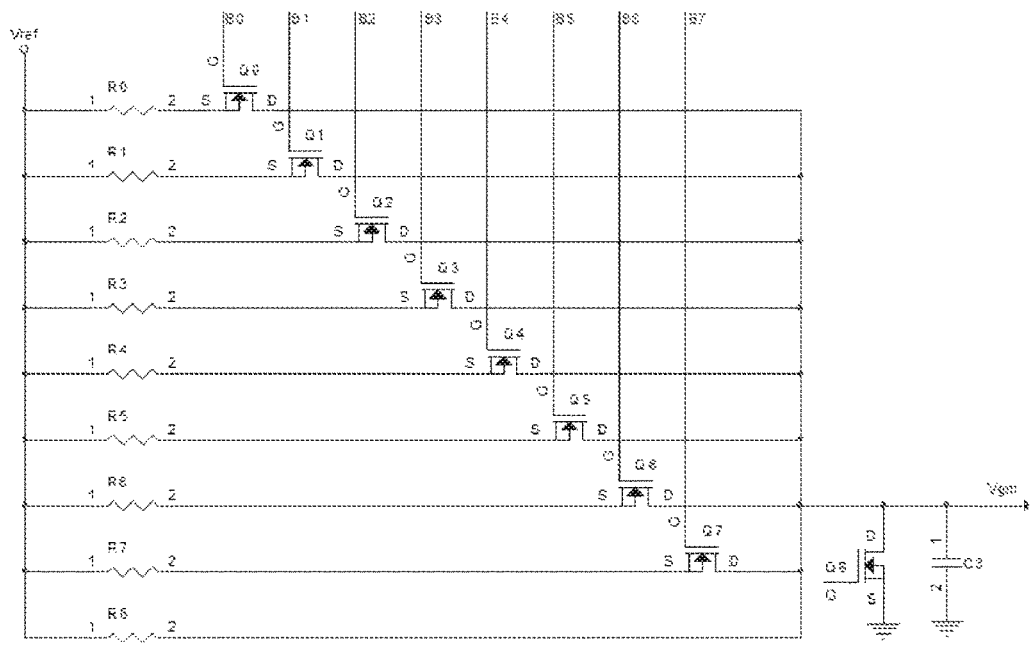
FIG. 2 is a circuit diagram of the DAC circuit according to the exemplary embodiment shown in the present disclosure.

Refer to FIG. 2, with the DAC circuit inputted 8 bit as an example to describe the working principle of the DAC circuit of the exemplary embodiment of the present disclosure.

FIG. 2 is a circuit diagram of the DAC circuit according to the exemplary embodiment shown in the present disclosure.

Shown in FIG. 2, in the present embodiment, the input of the DAC circuit is 8 bit (i.e. B0~B7), wherein, B7 is the highest digital bit, B0 is the lowest digital bit, the DAC circuit includes 8 first MOS transistors (i.e. Q0~Q7) and 8 first resistors (R0~R7), each connecting method of the first MOS transistor are the same, with the first MOS transistor Q0 as an example, the gate of the first MOS transistor Q0 receives the digital bit B0, the source of the first MOS transistor Q0 connects to the one end of the first resistor R0, the other end of the first resistor R0 connects to the reference voltage (Vref), the drain of the first MOS transistor Q0 connects to the output terminal of the DAC circuit, here, the first resistor R0 and the first MOS transistor Q0 are connected in series as a channel.

Further, the number of the first resistor is the same with the number of the first MOS transistor, each resistance of the first resistor is varied with the varying of the power of the digital bit. Here, as shown in FIG. 2, the resistance of the first resistor R0~R7 is gradually reduced, i.e. the resistance of the first resistor (R7) through the first MOS transistor (Q7) connecting with the highest digital bit B7 is lowest, the resistance of the first resistor (R0) through the first MOS transistor (Q0) connecting with the lowest digital bit B0 is biggest.

The one end of the second resistor (R8) connects to the reference voltage (Vref), the other end of the second resistor (R8) connects to the output terminal of the DAC circuit. Here, the resistance of the second resistor (R8) is greater than the resistance of the first resistor (R0) connecting with the lowest digital bit B0.

The drain of the second MOS transistor (Q8) connects to the output terminal of the circuit, the source of the second MOS transistor (Q8) is grounded, the gate of the second MOS transistor (Q8) receives the row blank signal (H Blanking), the one end of the capacitor (C3) connects to the output terminal, the other end of the capacitor (C3) is grounded.

The any one of the first MOS transistor is turned on the any one of the first MOS transistor according to the value of the digital bit received from the gate, so that the first resistor of the any one of the first MOS transistor connected is accessed into the circuit, between the each first resistor in the accessed circuit is connected in parallel, between the each first resistor and the second resistor in the accessed circuit is connected in parallel.

Further, the gray voltage of the output terminal of the digital to analog conversion circuit of the exemplary embodiment shown in the present disclosure may calculated by the following equation:

$$V_{gm} = V_{ref} - V_{ref} e^{-t/RC} \quad (1)$$

In the equation (1), $V_{gm}$ is the gray voltage of the output terminal of the digital to analog conversion circuit, $V_{ref}$ is the reference voltage, R is the resistance of the each first resistor and second resistor in the accessed circuit after connected in parallel, C is capacitor, t is the charge time of the capacitor.

As an exemplary, assuming all the MOS transistor (Q0~Q8) are high conduction, when the digital bit (B0~B7) are low, all of the first MOS transistor (Q0~Q7) are non-conductive, only the second resistor (R8) is received in the circuit, i.e. the resistance of the R in the equation (1) is the resistance of the second resistor R8, in this case, the value of the DAC circuit outputted $V_{gm}$ is the gray voltage value when the corresponding digital bits are all zero (are low).

When the digital bit B0 is high level, the gate of the first MOS transistor Q0 received is high level signal, so that the first MOS transistor Q0 is turned on, the first resistor R0 connected with the first MOS transistor Q0 is accessed in the circuit, in this case, the resistance of the R in the equation (1) is the resistance of the first resistor R0 and the second resistor R8 has been connected in parallel, the value of the DAC circuit outputted $V_{gm}$ is the gray voltage value when the corresponding digital bit is 00000001.

Similarly, when the digital bit B0 and B3 is high level, the gate of the first MOS transistor Q0 received is high level signal, so that the first MOS transistor Q0 is turned on, the first resistor R0 connected with the first MOS transistor Q0 is accessed in the circuit, further, the gate of the first MOS transistor Q3 receives the high level signal, so that the first MOS transistor Q3 is turned on, the first resistor R3 connected with the first MOS transistor Q3 is accessed in the circuit, in this case, the resistance of the R in the equation (1) is the resistance after the first resistor R0, the first resistor R3, the second resistor R8 connected in parallel, the value of the DAC circuit outputted $V_{gm}$ is the gray voltage value when the corresponding digital bit is 00001001.

Here, according to the above-described manner, after the entire design of the DAC circuit is completed, the capacitance of the capacitor (C3) is fixed, the resistance of the R in the equation (1) is changed by the change of the number of the first resistor in the access circuit, and then to adjust the output gray voltage value of the DAC circuit.

Further, the resistance of the each first resistor and second resistor accessed in the circuit after connected in parallel and the gray voltage of the output terminal of the digital to analog conversion circuit are presented as varies nonlinearly.

Figure 3:
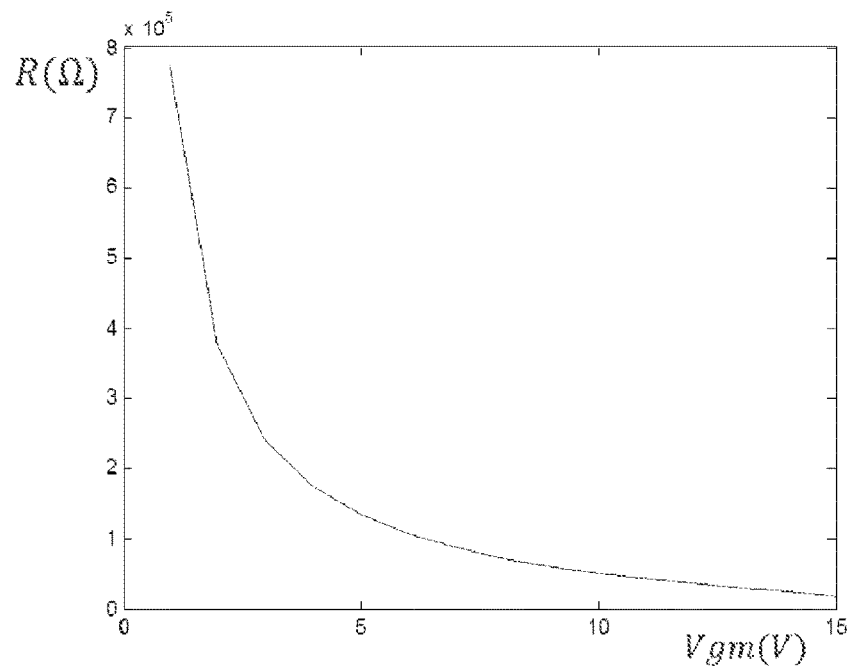
FIG. 3 is a variation curve of the output voltage of the DAC circuit according to the exemplary embodiment of the present disclosure shown in FIG. 2.

FIG. 3 is a variation curve of the output voltage of the DAC circuit according to the exemplary embodiment of the present disclosure shown in FIG. 2.

As shown in FIG. 3, the curve performance the relationship between the output voltage of the DAC circuit (i.e. gray voltage $V_{gm}$) and the R in the equation (1), here, R is the resistance of the each first resistor and second resistor in the DAC circuit after connected in parallel, further, the trend of the curve shown in FIG. 3 is the same with the trend of the GAMA curve of the display panel, i.e. in line with changes of GAMA curve.

Further, the data source circuit chip (source IC) of the DAC circuit of the exemplary embodiment of the present disclosure is used to provide the gray voltage to the display panel.

Figure 4:
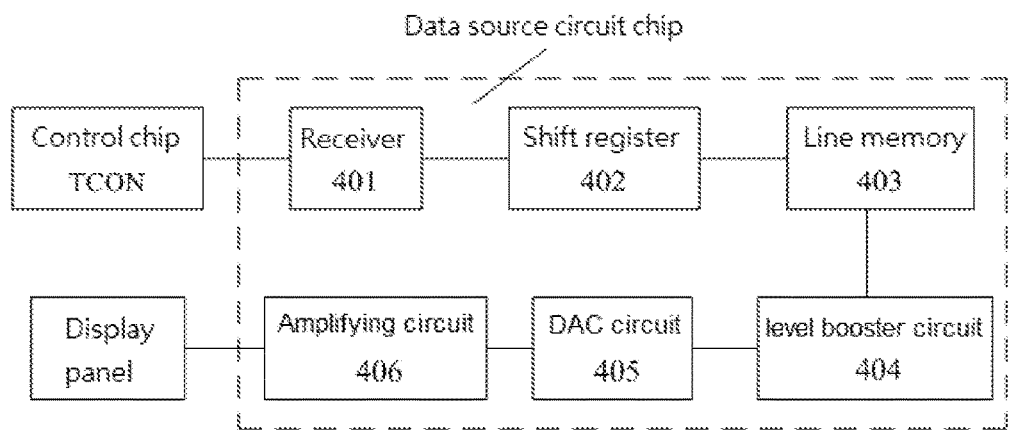
FIG. 4 is a structure diagram with the data source chip of the DAC circuit according to the exemplary embodiment of the present disclosure shown in FIG. 2.

FIG. 4 is a structure diagram with the data source chip of the DAC circuit according to the exemplary embodiment of the present disclosure shown in FIG. 2.

As shown in FIG. 4, the data source chip of the exemplary embodiment of the present disclosure includes: a receiver 401, a shift register 402, a line memory 403, a level booster circuit 404, a DAC circuit 405 and an amplifying circuit 406.

Specifically, the receiver 401 converts the differential voltage signal received from the control chip (TCON) to the digital bit signal, and sends the digital bit to the shift register 402 through the serial transmission way.

The shift register 402 converts the serial transmission digital bit signal received from the receiver 401 to be the parallel transmission digital bit signal.

The line memory 403 is arranged the parallel transmission digital bit signal from the shift register 402 by the display position of the display panel, and the digital bit signals are stored according to the order.

The level booster circuit 404 is boosts the working voltage of the digital bit to the analog working voltage.

The DAC circuit 405 is converts the digital bit signal to the analog voltage value (i.e. gray voltage).

Here, as has been described the circuit structure of the DAC circuit 405 in the FIG. 2, the contents of this part of the present disclosure is omitted.

The amplifying circuit 406 amplifies the gray voltage and provides the amplified gray voltage to the display panel.

In the present embodiment, the gray voltage of the data source chip outputted may charge and discharge to the display panel (for example, LCD panel or LED panel) through the display data line on the display array, such that the each pixel in the display panel may accordance with the gray voltage for normal display.

Using the source IC shown in FIG. 4, replacing the DAC circuit of the exemplary embodiment of the present disclosure to the traditional DAC module, the number of the switch MOS transistor of the each 8 bit source IC channel required may be reduced from 2048 to 8, greatly reducing the volume of the source IC and the cost.

Refer to FIG. 2, in general, a horizontal scanning period of the display panel includes the display stage and the display blank stage, the each first MOS transistor in the DAC circuit in the display stage is turned on by the value of the digital bit, to charge the capacitor, so that provides the corresponding output gray voltage to the display panel, normal displaying the display panel. In this case, the row blank signal is low level signal, the second MOS transistor is turned off and not accessed in the circuit.

In the display blank stage, all of the first MOS transistor are turned off, in this case, the row blank signal is high level signal, the second MOS transistor (Q8) is turned on according to the row blank signal, the capacitor C3 is discharged through the second MOS transistor (Q8), the residual charge on the capacitor C3 are all freed, so every time before charging for the capacitor C3, the charge of the capacitor C3 is zero.

As an example, the capacitance of the capacitor (C3) may according to the cross voltage between the highest charge voltage and the lowest charge voltage of the display panel (i.e. the voltage difference between the highest charge voltage and the lowest charge voltage) and the charging time of the display panel to determine the RC value. It should be understood, the R value is the resistance of the each first resistor and second resistor in the accessed circuit after connected in parallel (i.e. the R value in the equation (1)), the C value is the capacitance of the capacitor C3.

Here, after determining the display panel, the resolution of the display panel will be determined (e.g., 4K or 1080P, or the like), since the charge time of the each line display panel t0 is known, for example, assuming that the resolution of the display panel is 1080P, with 60 frames per second as an example, one frame is corresponded 1080 lines, then the RC should be met within the charging time t0, the charging voltage of the display panel can be boosted a value of one cross voltage.

Using the above DAC circuit and data source circuit chip, can greatly reduce the number of the MOS transistor used in the DAC circuit, to effectively reduce the volume of the data source circuit chip and cost. Further, the above DAC circuit and data source circuit chip can also significantly increase the economic efficiency of the source IC products to enhance the competitiveness of the market price of the product.

As already described in conjunction with specific embodiments of the present disclosure, but the embodiment of the present disclosure is not limited thereto. Within the spirit and scope of the present disclosure, those skilled in the art that various modifications and variations, modifications and variations which fall within the scope of protection defined by the claims.

What is claimed is:

1. A digital to analog conversion circuit, the circuit comprises: a plurality of first MOS transistors, wherein a number of the plurality of first MOS transistors is the same with a number with the same number of a plurality of inputted digital bits, wherein, any one of the a gate of any one of the plurality of first MOS transistors receives one of the plurality of digital bits, the any one of the a drain of the any one of the plurality of first MOS transistors connects to an output terminal of the circuit, the any one of the a source of the any one of the plurality of first MOS transistors connects to one end of one of a plurality of first resistance resistors, another end of the one of the plurality of first resistance resistors connects to a reference voltage, a second resistance resistor, one end of the second resistance resistor connects to the reference voltage, another end of the second resistance resistor connects to the output terminal of the circuit, a second MOS transistor, a drain of the second MOS the circuit, a source of the second MOS, transistor is grounded, a gate of the second MOS transistor receives a row blank signal, a capacitor, one end of the capacitor connects to the output terminal of the circuit, another end of the capacitor is grounded, wherein, the any one of the plurality of first MOS transistors is turned on according to a value of the one of the plurality of digital bits received from the gate of the any one of the plurality of first MOS transistors, so that the one of the plurality of first resistors connected to the any one of the plurality of first MOS transistors is connected to the circuit, each of the plurality of first resistors connected to the circuit and the second resistor are parallel connected, wherein a relationship between a resistance of the parallel connected resistors and a gray voltage of the output terminal of the digital to analog conversion circuit is nonlinear;

wherein, the gray voltage of the output terminal of the digital to analog conversion circuit is calculated by the following:

$$V_{gm} = V_{ref} - V_{ref} * e^{-t/RC}$$

wherein, $V_{gm}$ is the gray voltage of the output terminal of the digital to analog conversion circuit, $V_{ref}$ is the reference voltage, R is the resistance of the parallel connected resistors, C is a capacitance of the capacitor, t is a charge time of the capacitor.

2. The circuit according to claim 1, wherein, the capacitance of the capacitor is fixed.

3. A data source circuit chip, the data source circuit chip comprises a receiver, a shift register, a line memory, a level booster circuit and a digital to analog conversion circuit according to claim 1 and an amplifying circuit.

4. The data source circuit chip according to claim 3, wherein, the capacitance of the capacitor is fixed.

* * * * *